May 7, 1963 F. B. ROBERTS ET AL 3,089,088

EXTENDED BANDSPREAD TUNING FOR A COMMUNICATIONS RECEIVER

Filed Nov. 13, 1961 2 Sheets-Sheet 1

INVENTORS
FRANK B. ROBERTS
WILLIAM F. GENETT

BY Kenway, Jenney & Hildreth

ATTORNEYS

INVENTORS
FRANK B. ROBERTS
WILLIAM F. GENETT
BY
Kenway, Jenney & Hildreth
ATTORNEYS United States Patent Office 3,089,088

Patented May 7, 1963

3,089,088
EXTENDED BANDSPREAD TUNING FOR A COMMUNICATIONS RECEIVER

Frank B. Roberts, Marblehead, and William F. Genett, Burlington, Mass., assignors to National Company, Inc., Malden, Mass., a corporation of Massachusetts Filed Nov. 13, 1961, Ser. No. 151,742
7 Claims. (Cl. 325—455)

This invention relates to general coverage communications receiver, and more particularly, to a novel and improved means for providing increased bandspread tuning of such a receiver.

General coverage communications receiver generally embody a main tuning condenser and a bandspread tuning condenser of smaller range connected in parallel to the main tuning condenser. The receiver may be tuned with either of the capacitors since the adjustment of either capacitor effects the resonant circuit. Since the bandspread condenser is appreciably smaller in range than the main tuning condenser, it acts as a vernier tuning device, the range of which is a function of its own size and also a function of the setting of the larger main tuning condenser. It is a common practice to provide a main tuning dial and indicator arrangement to provide a coarse indication of the frequency to which the receiver is tuned. The main tuning dial normally has a plurality of bands or range of frequencies each corresponding to a full range of adjustment of the main tuning condenser. It is also a common practice to provide a bandspread tuning dial and indicator arrangement coupled to the bandspread tuning condenser to provide a fine indication of the tuning of the receiver, but only over certain selected frequency ranges. More particularly, the bandspread tuning dial may be provided with a plurality of ranges of indicia corresponding respectively to frequency ranges, with each range of frequencies covering only a small portion of the frequency range of any one band on the main tuning dial. Because of space limitations in the receiver, it is normally not possible to provide a bandspread tuning dial having more than five or six frequency ranges. Accordingly, other portions of the main tuning bands are not provided with the bandspread tuning feature, although this is usually highly desirable.

One known construction of a bandspread indicator and dial comprises a rotatable disc or partial disc connected to the drive shaft extending from the bandspread condenser for rotation with the shaft and relative to a fixed indicator or reference. The dial is provided with a plurality of series of indicia arranged concentrically of the dial axis and with each range or series of indicia corresponding to full adjustment of the bandspread condenser. The bandspread condenser is normally adjustable through about 180° of shaft rotation. Accordingly, each series of indicia extends about the dial axis only about 180°. The necessary space allocation for the dial, however, is the same as it would be if the dial were rotatable 360°.

It is the primary object of the present invention to provide in a communications receiver a novel and improved bandspread dial and indicator mechanism whereby additional bandspread scales may be provided without materially increasing the space requirement for the bandspread dial, thereby providing bandspread tuning over additional ranges of frequency without necessitating the provision of additional separate dial and pointer mechanisms.

Other objects will be in part obvious, and in part pointed out more in detail hereinafter.

The invention accordingly consists in the features of construction, combination of elements and arrangement of parts which will be exemplified in the construction hereafter set forth and the scope of the application of which will be indicated in the appended claims.

Figure 2:
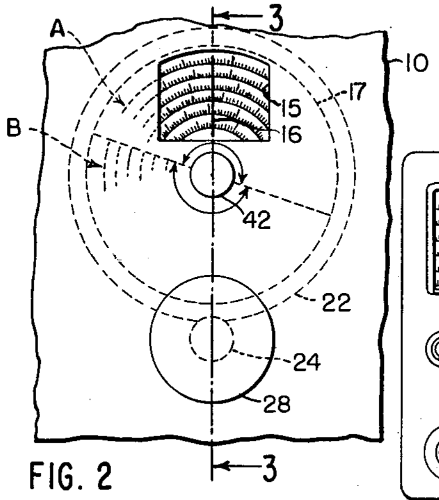
FIG. 2 is a bandspread tuning dial of an enlarged fragmentary front elevational view of the communication receiver of FIG. 1.
Figure 1:
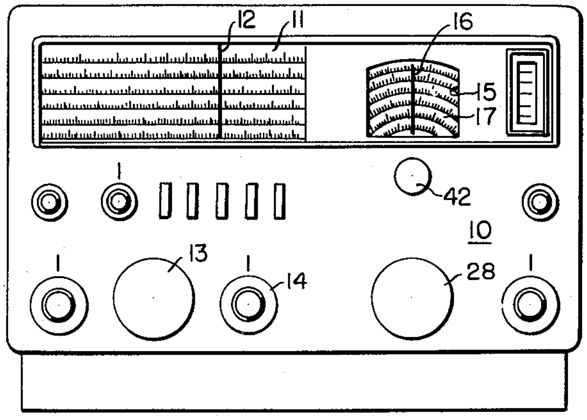
FIG. 1 is a front view of an exemplary general purpose communications receiver incorporating the present invention.

With reference to FIGS. 1 and 2, a general purpose communications receiver of a type with which this invention is concerned comprises a front panel 10 having a main tuning dial 11 and a movable pointer 12. The dial 11 has a plurality of parallel linearly arranged series of indicia corresponding to different frequency bands; for example, 540–1600 kc., 1.6–4.0 mc., 4.0–10.0 mc., etc. The indicator 12 is coupled to the main tuning condenser, not shown, and to a main tuning knob 13. Manual adjustment of the knob 13 will result in simultaneous adjustment of the main tuning condenser and the pointer 12. Selection of the desired tuning band or frequency range is provided by adjustment of a band selection knob 14.

The front panel is also provided with a viewing aperture or opening 15 across which extends a fixed indicator or reference 16. The indicator is cooperable with a bandspread dial 17 to provide an indication of the frequency to which the receiver is tuned. The adjusted position of the dial 17 corresponds to an adjusted position of the bandspread tuning condenser 18 which is connected in parallel with the main tuning condenser, not shown.

Figure 3:
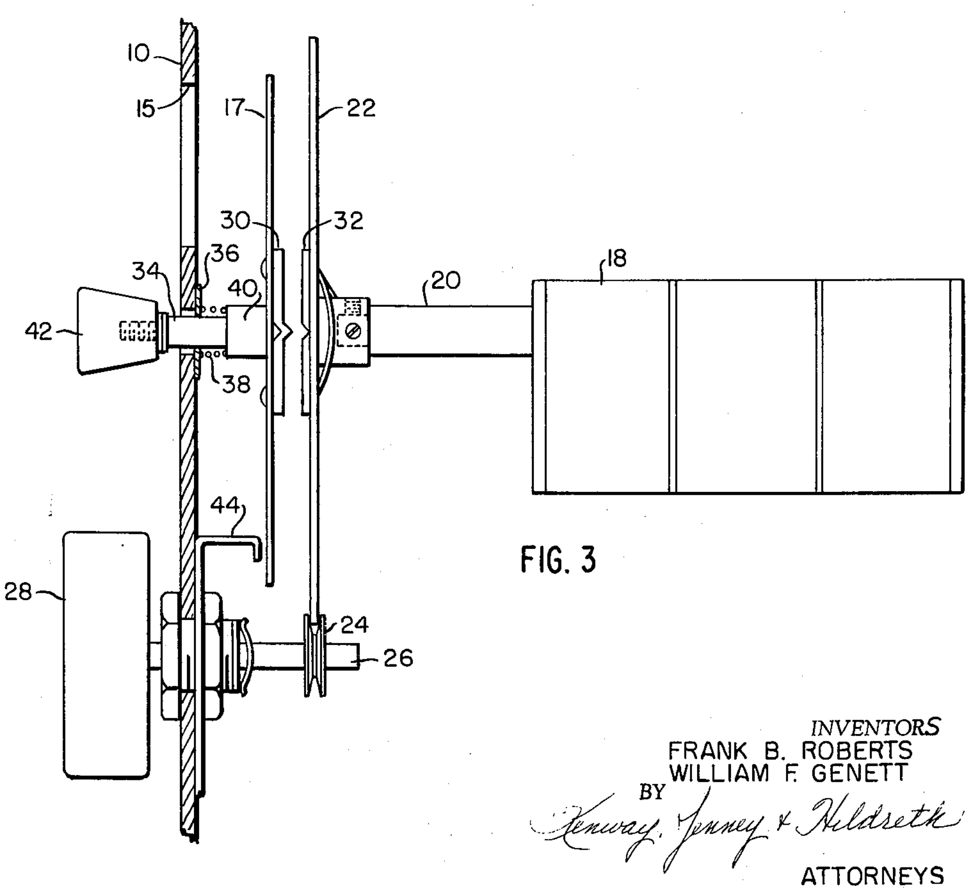
FIG. 3 is an enlarged, fragmentary, cross-sectional view substantially along the line 3—3 of FIG. 2.

The bandspread tuning dial 17 of the specific embodiment shown is in the form of a rotatable disc. The disc is provided with two sets of indicia generally indicated at A and B. Each set of indicia consists of a plurality of series of indicia with each series being arranged concentrically of the dial axis and spaced radially of each other. Each of the series of indicia on the bandspread dial correspond to a selected portion of one of the main tuning bands. With reference to FIGS. 2 and 3, the bandspread condenser 18 has a control shaft 20 rotatable through approximately 180° which corresponds to the range of adjustment of the condenser. A drive disc 22 is mounted coaxially on the end of the shaft 20 for rotation therewith. The drive disc 22 is engaged at its periphery by a pinion member 24 similar to a V-groove pulley. The peripheral edge portion of the drive disc 22 is engaged in the V-groove of the pinion member whereby rotation of the pinion member will result in rotation of the drive disc at a reduced angular speed. The pinion member 24 is mounted for rotation with a shaft 26 rotatably supported on the panel 10 and having a bandspread tuning knob mounted for rotation on its outer end.

As shown in FIGS. 2 and 3, the bandspread dial 17 and drive disc 22 are arranged concentrically of each other. The dial and drive disc are normally drivingly connected by a male detent 30 mounted on the dial 17 and a female detent 32 mounted on the drive disc 22. The detents are fixed for rotation with their respective members and are provided with mating V-shaped portions. The bandspread dial 17 is mounted for rotation with a rotatable and axially movable shaft 34 extending coaxially of the dial and through an aperture in the front panel. The shaft is journalled on a bearing 36 mounted on the front panel. A coil spring 38 is engaged between the bearing 36 and hub 40 on the shaft 34 to urge the dial toward the disc 22 and thus toward driving engagement with the disc.

In the operation of the receiver, the main tuning knob is actuated to set the main tuning indicator at a predetermined frequency indicia on the main dial. The bandspread tuning knob 28 is then adjusted to position the desired frequency indicia on the bandspread dial 17 in registry with the fixed bandspread indicator 16. It is contemplated that the set of frequency ranges for example, in the A portion of the bandspread dial will correspond to selected portions of the amateur frequencies, while the range of the frequency in the B portion of the bandspread dial will correspond to selected portions of the international broadcast frequencies. When it is desired to shift the bandspread dial, for example, to obtain bandspread coverage of foreign broadcast frequencies, a dial selector knob 42 on the outer end of the shaft 34 is pulled outwardly to disengage the detents 30 and 32. A stop 44 is provided as shown in FIG. 3 to limit the outward displacement of the dial 17 and to provide an indication that the dial has been disengaged from the drive disc. The knob 42 is then rotated 180° and released to permit the dial 17 to be urged toward the drive disc 22. It may be necessary to provide a slight rotation of the knob 42 to the detents 30 and 32. A different set of bandspread frequencies will now be in registry with the fixed indicator 16.

In the embodiment of FIGS. 2 and 3, adjustment of the bandspread dial 17 is accomplished without any corresponding adjustment of the bandspread tuning condenser 18. The shifting of the bandspread dial to bring a new set of frequencies into registry with the bandspread indicator is accomplished simply and quickly. The number of bandspread frequency ranges available for use may be twice the number permitted for the same diameter bandspread dial of a conventional arrangement. In this manner, bandspread coverage may be provided for example both for international broadcast bands as well as amateur bands thus increasing the usefulness of the receiver.

Figure 4:
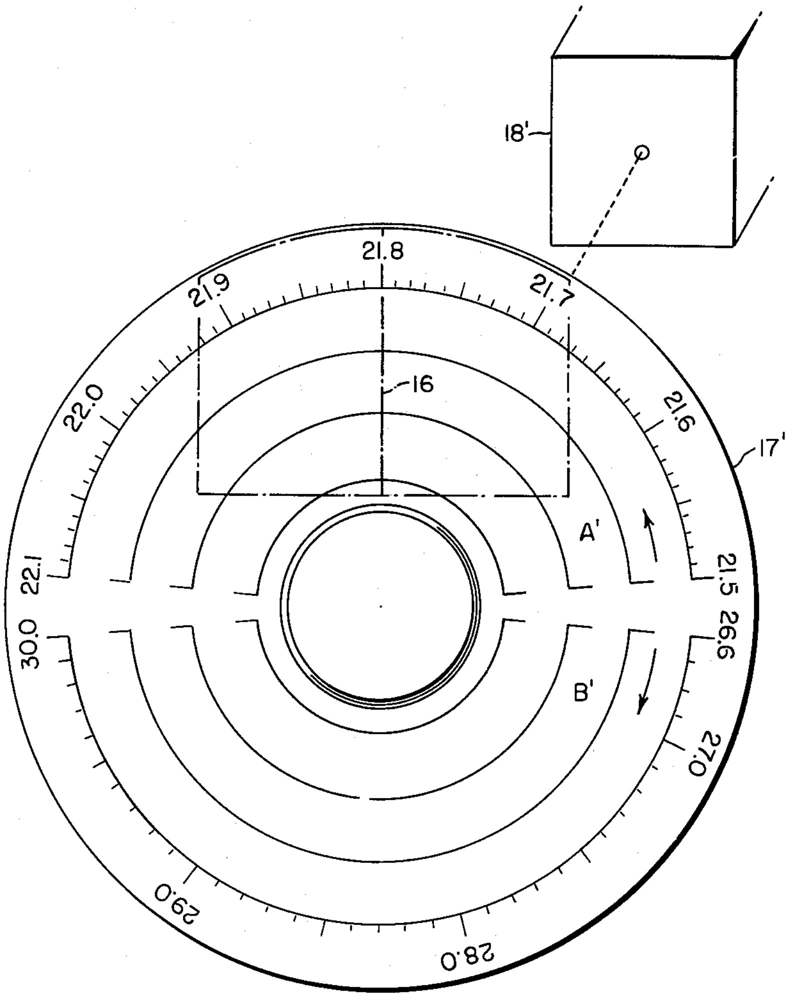
FIG. 4 is a front elevational view of an alternative embodiment of this invention.

With reference to FIG. 4, there is illustrated an alternative embodiment of the present invention. In the embodiment of FIG. 4, the bandspread condenser 18' is of a type in which the control shaft of the condenser and the movable elements of the condenser are rotatable through approximately 360° to adjust the condenser for a minimum capacitance to a maximum and back to the minimum value in response to continued rotation of the adjustment shaft in the same direction. The bandspread tuning dial 17' is suitably connected to the shaft of the condenser for movement therewith at a 1:1 ratio. The dial 17' has a plurality of sets of indicia A' and B' corresponding to the sets of indicia A and B of the previously described embodiment. However, in the embodiment of FIG. 4, the frequency in the set A' increases in a counterclockwise direction, as viewed in FIG. 4; while the frequency in the set B' increases in a clockwise direction, as viewed in FIG. 4. Accordingly, in order to adjust the dial 17' to bring a different set of frequencies into registry with the fixed indicator 16, the dial need only be rotated until a different set of ranges of frequency is in registry with the indicator. The condenser 18' will be simultaneously adjusted through either its maximum or minimum capacitance, whereupon the capacitance of the condenser will begin to reverse in a manner corresponding to the direction of frequency change on the dial. Therefore, in the embodiment of FIG. 4, the dial 17' is not disengaged from the bandspread tuning condenser as the dial is shifted to bring a new set of bandspread frequencies into registery with the fixed indicator 16.

It will be apparent to those skilled in the art from the foregoing that many variations and different embodiments could be provided to accomplish the desired objective while remaining within the scope of this invention. For example, the bandspread dial 17 rather than being disc-shaped could be an elongated member having a plurality of rectangular shaped scales spaced angularly about its axis whereby the dial scale member could be rotated to bring a different scale into registry with a movable slide rule type pointer. In such an arrangement, the pointer drive could be provided by any suitable coupling mechanism between the bandspread tuning knob and bandspread condenser. Additionally, if desired, ribbon types of dial scales or drum types could be utilized. Therefore, it is to be understood that it is intended that all matter contained in the above description or shown in the accompanying drawings shall be interpreted as illustrative and not in a limiting sense.

It is also to be understood that the language in the following claims is intended to cover all of the generic and specific features of the invention herein described and all statements of the scope of the invention which, as a matter of language, might be said to fall therebetween.

Having described our invention, we claim:

1. In a communications receiver of the type having a main tuning dial provided with a plurality of separate series of indicia corresponding to different frequency ranges, and adjustable main tuning condenser, and an adjustable bandspread tuning condenser; a relatively movable bandspread dial and cooperable indicator, said bandspread dial having a plurality of spaced apart sets of indicia, each set of indicia consisting of a plurality of different frequency ranges each corresponding to a small portion of one of the series of indicia on the main dial. said indicator being in registry with a selected one of said sets of indicia on the bandspread dial, means for adjusting the relative portion of the indicator and bandspread dial over the selected set of indicia and for providing simultaneous adjustment of said bandspread condenser, each frequency range on the bandspread dial corresponding to adjustment of the bandspread condenser between its maximum and minimum values of capacitance, and means for effecting relative movement between said indicator and bandspread dial to register a different set of indicia with said indicator.

2. In a communications receiver of the type having a main tuning dial provided with a plurality of series of indicia corresponding to different tuning bands, means for varying the tuning band of the receiver, and an adjustable bandspread tuning condenser; a relatively movable bandspread tuning dial and cooperable indicator, said bandspread dial having a plurality of spaced apart sets of indicia, each set of indicia consisting of a plurality of different frequency ranges falling within different ones of said bands, each of said frequency ranges corresponding to a small portion of one of the bands on the main dial, said indicator being in registry with a selected one of said sets of indicia, means for adjusting the relative position of said indicator and bandspread dial over the selected set of indicia and for simultaneously adjusting said bandspread condenser, and means for effecting relative movement between said bandspread dial and indicator to register a different set of indicia with said indicator.

3. In a communications receiver of the type having a main tuning dial provided with a plurality of separate series of indicia corresponding to different frequency ranges, an adjustable main tuning condenser, and an adjustable bandspread tuning condenser; a bandspread dial and cooperable indicator one of which is manually driven relative to the other to vary the bandspread dial setting within a given frequency range and is drivingly connected to said bandspread condenser for simultaneous adjustment thereof, said bandspread dial having a plurality of spaced apart sets of indicia, each set consisting of a plurality of different ranges of frequency each corresponding to adjustment of said bandspread condenser over its full range of capacitance, said dial being positioned relative to the indicator whereby a selected one of said sets of indicia is in registry with the indicator, and means for adjusting the dial to bring a different set of indicia into registry with the indicator.

4. In a communications receiver of the type having a main tuning dial provided with a plurality of separate series of indicia corresponding to different frequency bands, and adjustable main tuning condenser, and an adjustable bandspread tuning condenser; a movable bandspread dial and cooperable fixed indicator, said bandspread dial having a plurality of spaced apart sets of indicia, each set of indicia consisting of a plurality of different frequency ranges each corresponding to a small portion of one of the series of indicia on the main dial, said indicator being in registry with a selected one of said sets of indicia on the bandspread dial, means for moving the dial relative to the indicator and for simultaneously adjusting the bandspread condenser to adjust the tuning of the receiver within a selected bandspread frequency range, and means for moving the dial relative to the indicator and independently of the bandspread condenser to bring a different set of bandspread indicia into registry with the indicator.

5. In a communications receiver of the type having a main tuning dial provided with a plurality of separate series of indicia corresponding to different frequency bands, and adjustable main tuning condenser, and an adjustable bandspread tuning condenser; a rotatable bandspread dial, a fixed indicator, said bandspread dial having a plurality of angularly spaced apart sets of indicia, each set consisting of a plurality of series of indicia extending concentrically about the dial axis and corresponding to a small portion of one of the main bands on the main dial, said indicator being in registry with one of said sets, vernier drive means for selectively adjusting the bandspread condenser, a disengageable driving connection between said drive means and said dial, and means for disengaging said connection and rotating said dial to bring a different set of indicia into registry with the indicator.

6. In a communications receiver of the type having a main tuning dial provided with a plurality of separate series of indicia corresponding to different frequency ranges, an adjustable main tuning condenser, and an adjustable bandspread tuning condenser; a bandspread dial mounted for rotation and for movement in the direction of its rotational axis, a fixed indicator cooperating with said bandspread dial, said bandspread dial having a plurality of angularly spaced apart sets of indicia, each set consisting of a plurality of series of indicia extending concentrically about the dial axis and corresponding to a small portion of one of the main bands on the main dial, said indicator being in registry with one of said sets of indicia, said bandspread condenser having a shaft, vernier drive means for rotating said shaft, spring pressed means connecting said bandspread dial and shaft, and a knob connected to said dial whereby the dial may be disconnected from said shaft in response to movement in the direction of its rotational axis, may then be rotated to bring a different set of indicia into registry with said indicator, and may then be reconnected with said shaft.

7. In a communications receiver of the type having a main tuning dial provided with a plurality of separate series of indicia corresponding to different frequency ranges; a bandspread tuning condenser having a shaft rotatable through approximately 360°, said condenser being adjustable between a first and a second capacitance and back to said first capacitance in response to approximately 360° of rotation of the shaft, a rotatable bandspread dial, a cooperable fixed indicator for said bandspread dial, and means for moving said dial and shaft simultaneously, said dial having a pair of sets of indicia spaced angularly about its axis, each set of indicia consisting of a plurality of series of frequency indicia arranged concentrically of the dial axis and each series corresponding to a small portion of one of the main tuning bands, the indicia of one set increases in frequency values in one direction about the dial axis, the indicia of the other set increasing in frequency values in the opposite direction about the dial axis.

No references cited.